(12) United States Patent
Wu et al.

(10) Patent No.: US 9,786,567 B2
(45) Date of Patent: Oct. 10, 2017

(54) CHIP-ON-WAFER PROCESS CONTROL MONITORING FOR CHIP-ON-WAFER-ON-SUBSTRATE PACKAGES

(71) Applicant: Taiwan Semiconductor Manufacturing Company, Ltd., Hsin-Chu (TW)

(72) Inventors: Wei-Cheng Wu, Hsin-Chu (TW); Li-Han Hsu, Hsin-Chu (TW); Sao-Ling Chiu, Hsin-Chu (TW); Shang-Yun Hou, Jubei (TW); Shin-Puu Jeng, Hsin-Chu (TW); Chen-Hua Lin, Douliu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/414,909

(22) Filed: Jan. 25, 2017

(65) Prior Publication Data

US 2017/0133282 A1 May 11, 2017

Related U.S. Application Data

(62) Division of application No. 13/905,958, filed on May 30, 2013, now Pat. No. 9,581,638.

(Continued)

(51) Int. Cl.
*G01R 31/26* (2014.01)
*H01L 21/66* (2006.01)
(Continued)

(52) U.S. Cl.
CPC .......... *H01L 22/14* (2013.01); *G01R 1/07314* (2013.01); *G01R 31/265* (2013.01); *G01R 31/2884* (2013.01); *H01L 22/12* (2013.01); *H01L 22/32* (2013.01); *H01L 24/17* (2013.01); *H01L 24/81* (2013.01); *H01L 25/0657* (2013.01); *H01L 25/50* (2013.01); *H01L 2224/16055* (2013.01); *H01L 2224/16113* (2013.01); *H01L 2224/16145* (2013.01); *H01L 2224/16146* (2013.01); *H01L 2224/16227* (2013.01); *H01L 2224/16235* (2013.01); *H01L 2224/1713* (2013.01);
(Continued)

(58) Field of Classification Search
CPC ............ G01R 31/2607; G01R 31/2884; G01R 31/2601; G01R 31/2642; G01R 31/3187; G01R 31/2812; G01R 31/2853
See application file for complete search history.

(56) References Cited

U.S. PATENT DOCUMENTS

| 4,684,884 A * | 8/1987 | Soderlund .......... G01R 31/2884 324/537 |
| 5,199,889 A | 4/1993 | McDevitt, Jr. |

(Continued)

*Primary Examiner* — Huy Q Phan
*Assistant Examiner* — David Frederiksen
(74) *Attorney, Agent, or Firm* — Slater Matsil, LLP

(57) ABSTRACT

An embodiment method includes providing a standardized testing structure design for a chip-on-wafer (CoW) structure, wherein the standardized testing structure design comprises placing a testing structure in a pre-selected area a top die in the CoW structure, and electrically testing a plurality of microbumps in the CoW structure by applying a universal testing probe card to the testing structure.

20 Claims, 3 Drawing Sheets

Related U.S. Application Data

(60) Provisional application No. 61/780,759, filed on Mar. 13, 2013.

(51) Int. Cl.
  *G01R 31/28* (2006.01)
  *G01R 1/073* (2006.01)
  *G01R 31/265* (2006.01)
  *H01L 25/00* (2006.01)
  *H01L 23/00* (2006.01)
  *H01L 25/065* (2006.01)

(52) U.S. Cl.
  CPC ............ *H01L 2225/06513* (2013.01); *H01L 2225/06541* (2013.01); *H01L 2225/06596* (2013.01)

(56) References Cited

U.S. PATENT DOCUMENTS

| | | | |
|---|---|---|---|
| 5,378,981 A * | 1/1995 | Higgins, III | G01R 31/2831 257/E23.055 |
| 5,757,201 A * | 5/1998 | Partridge | G01R 31/2886 324/756.02 |
| 5,828,223 A | 10/1998 | Rabkin et al. | |
| 6,407,450 B1 * | 6/2002 | Verma | H01L 23/49838 257/697 |
| 6,430,047 B2 * | 8/2002 | Wentzel | G01R 1/0408 165/80.3 |
| 6,564,986 B1 | 5/2003 | Hsieh | |
| 7,141,996 B2 | 11/2006 | Chang et al. | |
| 7,279,795 B2 | 10/2007 | Peraman et al. | |
| 7,576,435 B2 | 8/2009 | Chao | |
| 7,642,800 B2 | 1/2010 | Ku et al. | |
| 8,378,700 B2 | 2/2013 | Watanabe et al. | |
| 2003/0076125 A1 | 4/2003 | McCord | |
| 2010/0117673 A1 | 5/2010 | Lee et al. | |
| 2012/0168964 A1 | 7/2012 | Kim | |
| 2012/0206160 A1 | 8/2012 | Wu et al. | |
| 2012/0212247 A1 | 8/2012 | Sakata et al. | |
| 2012/0246514 A1 | 9/2012 | Chen et al. | |
| 2014/0051189 A1 | 2/2014 | Kai-Jun et al. | |
| 2014/0091819 A1 | 4/2014 | Gong et al. | |
| 2014/0183748 A1 | 7/2014 | Ooi et al. | |
| 2014/0189456 A1 | 7/2014 | Loh et al. | |

* cited by examiner

CHIP-ON-WAFER PROCESS CONTROL MONITORING FOR CHIP-ON-WAFER-ON-SUBSTRATE PACKAGES

This application is a divisional of U.S. application Ser. No. 13/905,958, filed May 30, 2013, entitled "Chip-on-Wafer Process Control Monitoring for Chip-on-Wafer-on-Substrate Packages," which claims the benefit of U.S. Provisional Application No. 61/780,759, filed on Mar. 13, 2013, entitled "Chip-on-Wafer Process Control Monitoring for Chip-on-Wafer-on-Substrate Packages," which applications are hereby incorporated herein by reference.

BACKGROUND

As semiconductor technologies evolve, three dimensional (3D) integrated circuits (ICs) emerge as an effective alternative to further reduce the physical size of a semiconductor chip. One form of 3D IC is a chip-on-wafer-on-substrate (CoWoS) package. In a CoWoS package, a variety of chips comprising active circuits are first attached to an interposer wafer using micro-bumps (μbumps) to form a chip-on-wafer (CoW) structure. The variety of chips may be interconnected using through silicon vias (TSVs) in the interposer wafer. The CoW structure may then be attached to a substrate to form the completed CoWoS package. Typically, a CoWoS package allows for higher yield, higher connection densities, smaller form factors, and increased cost-effectiveness. A CoWoS package also allows for improved connections between the chip and the interposer wafer compared to other 3D IC packages (e.g., packages wherein the interposer wafer is first attached to the substrate before the variety of chips are attached).

As part of the CoW formation process, the number of μbumps used to connect the chip to the interposer wafer may number in the tens of thousands. A bad connection in any one of these μbumps may cause the entire packaged device to fail. Therefore, testing the interconnection quality of the CoW structure is an important aspect of the CoWoS packaging process. Currently, two types of CoW connection testing methods may be used: physical examination (e.g., a sampling of chips are x-rayed and examined manually) or product chip probing (CP).

Physical examination CoW testing may be unreliable and time-consuming. For example, a given wafer may include a hundred or more chips, and there may be twenty-five or more wafers in a lot. Furthermore, it may take a human twelve minutes or more to inspect a chip for bad connections. It is physically unrealistic to examine every chip in a lot; therefore, only a sampling of chips are examined (e.g., as few as five chips/wafer and one wafer/lot may be randomly sampled and examined). This low sampling rate restriction results in unreliable testing results, but sampling rates are not easily increased due to the time-consuming nature of the testing process. The unreliable nature of physical examination CoW testing may also be exacerbated by human error and limitations in the type of detectable connection failures (e.g., only bridged connections are readily visible, but other connection failures, such as voids, may still be present).

Product CP CoW testing involves functionally testing the electrical connections between the chip and the wafer. While this type of testing is less time consuming and more reliable than physical examination, product CP testing is inherently costly due to its chip-specific nature. That is, chip testing designs and testing probes are specific to a particular chip layout. Active circuits in a chip must be rerouted to peripheral regions of the interposer wafer to provide access for a testing probe to perform functional tests. This rerouting pattern is dependent on the circuit layout of a chip; therefore product CP testing creates an added cost for each chip and does not allow for standardized testing procedures.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely chip-on-wafer (CoW) process control monitoring for a chip-on-wafer-on-substrate (CoWoS) package. Other embodiments may also be applied, however, to other chip or packaging structures using interconnect bumps (e.g., μbumps, controlled collapse chip connection (C4s), ball grid arrays (BGAs), and the like) as connectors. For example, other embodiments may be applied to flip-chip packaging, wafer-level chip-scale packaging (CSP), package-on-package (POP) packaging, and the like.

Figure 1:
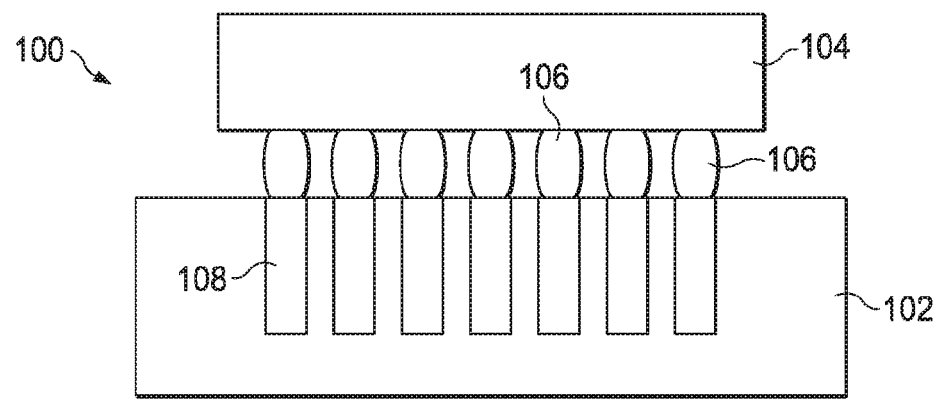
FIG. 1 is a cross-sectional view of a typical chip-on-wafer (CoW) structure.

With reference now to FIG. 1, there is shown a cross-sectional representation of a chip-on-wafer (CoW) structure 100, which may be used to form a chip-on-wafer-on-substrate (CoWoS) package. CoW structure 100 includes a bottom die 102 connected to a top die 104 through a multitude of micro-bumps (μbumps) 106. Top die 104 may be a chip comprising functional, active circuits (not shown). Bottom die 102 may be an interposer wafer, which may or may not include functional circuits. Bottom die 102 may include a plurality of through silicon-vias (TSVs) 108. Active circuits in top die 104 may be interconnected using TSVs 108. For ease of illustration, FIG. 1 illustrates CoW 100 as only having seven μbumps; however, in reality CoW 100 may have tens of thousands of μbumps connecting top die 104 to bottom wafer 102.

Various embodiments allow for standardized, reliable resting of CoW structures by providing a design with test structures for inclusion in a pre-selected area of a top die of the CoW structure. A pre-selected area may be a sensitive area of the top die that is most susceptible to connection issues (e.g., corner regions of the top die where connection stress may have the most impact). Furthermore, the test structure design is a standard design that may be included in a variety of different top dies and is not dependent on the chip layout of various components in the different top dies.

That is, the same test structure design may be used in a variety of CoW top dies and may therefore be referred to as a standardized test structure design.

The standardized test structure design may be incorporated and implemented into the layout of the top die, and the top die may be attached to the bottom die to form a CoW structure having standardized test structures. Electrical testing is performed on microbump connections of the CoW structure having standardized test structures. Subsequently, if the CoW structure passes the electrical test, it may be attached to a substrate to create a chip-on-wafer-on-substrate (CoWoS) package having known reliable connections between the active chip and the interposer wafer (i.e., the top and bottom dies).

Figure 2A:
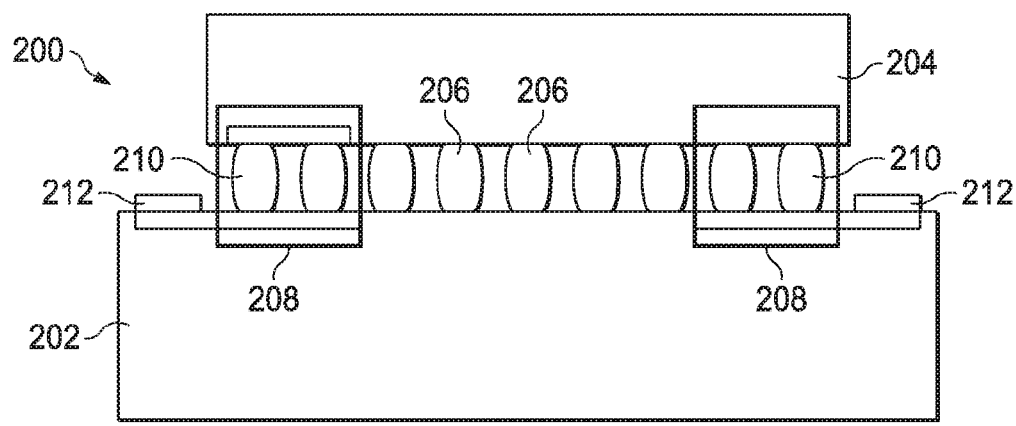
FIGS. 2A-2C are varying views of a CoW structure including standardized testing structures in accordance with various embodiments.

FIG. 2A illustrates a cross-sectional view of a CoW structure 200 including standardized test structures in accordance with various embodiments. CoW structure 200 includes bottom die 202 attached to top die 204 through a plurality of μbumps 206. Bottom die 202, top die 204, and μbumps 206 may be substantially similar to bottom die 102, top die 104, and μbumps 106 in FIG. 1.

CoW structure 200 includes testing structures 208 electrically connected to probing pads 212. Testing structures 208 may be referred to as standardized testing structures because they are able to be included in a variety CoW structures regardless of the layout the components (not shown) in top dies 204. For example, a sample IC layout including guidelines and design rules for inserting standardized testing structures 208 may be provided for inclusion in designing the layout of top die 204. Standardized testing structures 208 includes a plurality of microbumps 210, which may be configured in different patterns to allow for various physical measurement tests on the connection quality between top die 204 and bottom die 202.

Figure 2B:
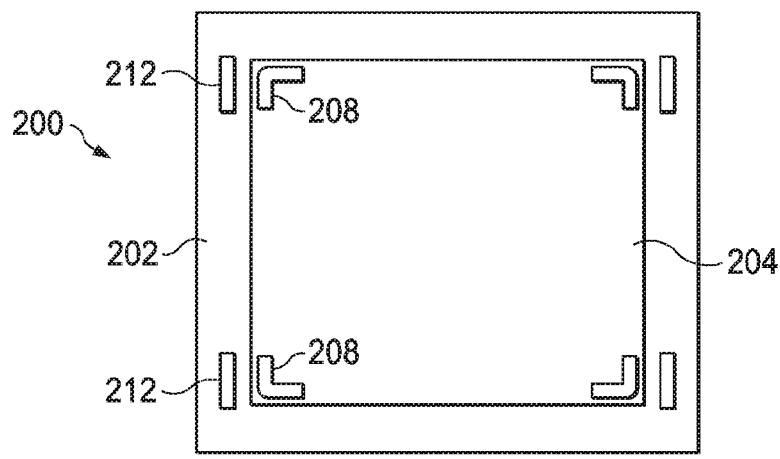

Standardized testing structures 208 are disposed in pre-selected areas of CoW structure 200. For example, FIG. 2B illustrates a top-down view of CoW structure 200 with standardized testing structures 208 disposed in corners regions of CoW structure 200. Corner regions of a die are high-stress regions, which may be relatively susceptible to connection issues compared to other regions of a die. Therefore, by placing testing structures in these pre-selected, regions (e.g., high-stress corner regions), the connection quality of all μbumps 206 may be extrapolated. Although FIG. 2B illustrates standardized testing structures as disposed in corner regions of CoW structure 200, alternative embodiments include standardized testing structures 208 being placed in other regions of CoW structure 200. For example, standardized testing structures 208 may also be placed in center regions of top die 204 instead of or in addition to corner regions.

Various embodiments perform electronic testing of CoW structure 200 through standardized testing structures 208 disposed in pre-selected areas of CoW structure 200 instead of performing full functional tests. Thus, the size of standardized testing structures 208 may be kept relatively small, and standardized testing structures 208 may be inserted in a variety of layouts without the need for complex rerouting or redesign of functional components in top die 204. Furthermore, when testing structures 208 are placed in corner regions of CoW structure 200, electrical routing to probing pads 212 may be minimized due to the close proximity of corner regions to peripheral regions of bottom die 202.

Standardized testing structures 208 may be configured in any shape. For example, FIG. 3 illustrates standardized testing structures 208 as having an L-shape to fully test the corner region of CoW structure 200. Alternative embodiments include standardized testing structures 208 having different shapes such as a straight line, a rectangle, a square, a circle, a border around peripheral regions of top die 204, or the like.

Figure 2C:
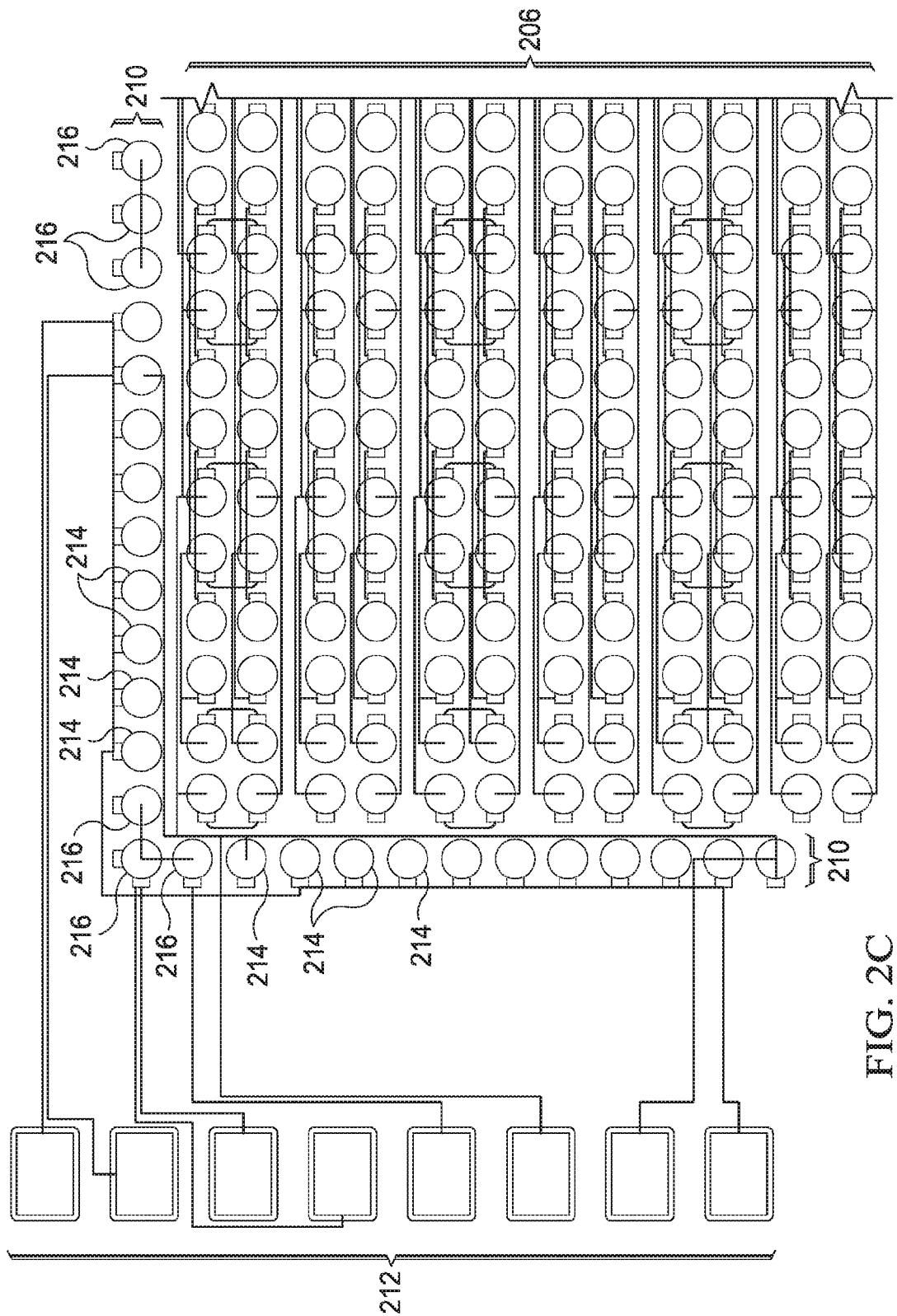

Standardized testing structures 208 include a plurality of μbumps 210, which may also be referred to as test bumps 210. Test bumps 210 may be configured in various physical measurement patterns to enable electrical testing of the connection quality of top die 204 to bottom die 202. For example, FIG. 2C shows test bumps 210 being configured in daisy chains 214 (to test electrical continuity of μbumps connections) and kelvin structures 216 (to test the resistance of μbumps) electrically connected to probing pads 212. In various embodiments, test bumps 210 may be configured in any pattern including one or more daisy chains, one or more kelvin structures, other physical measurement patterns, or combinations thereof.

Standardized testing structures 208 are electrically connected to probing pads 212. As shown in FIGS. 2A-2B, probing pads 212 are located on the peripheral regions of bottom die 202. That is, probing pads 212 are not covered by top die 204, and may be accessed by a testing apparatus such as a testing probe card (not shown). Generally, testing probe cards may be used to perform electrical tests on structures in an IC structure. The configuration of testing probe cards is implementation specific and based on the structure to be tested. Because standardized testing structures 208 may be constant across a variety of CoW structures, various embodiments allow for a universal testing probe card to be used in CoW testing. That is, the same testing probe card configuration may be used to test a variety of CoW structures and reduces the need to configure CoW structure specific testing probe cards. For example, the number of probing tips and probe pitch of the universal testing probe card may be constant and used to test a variety of CoW structures.

Figure 3A:
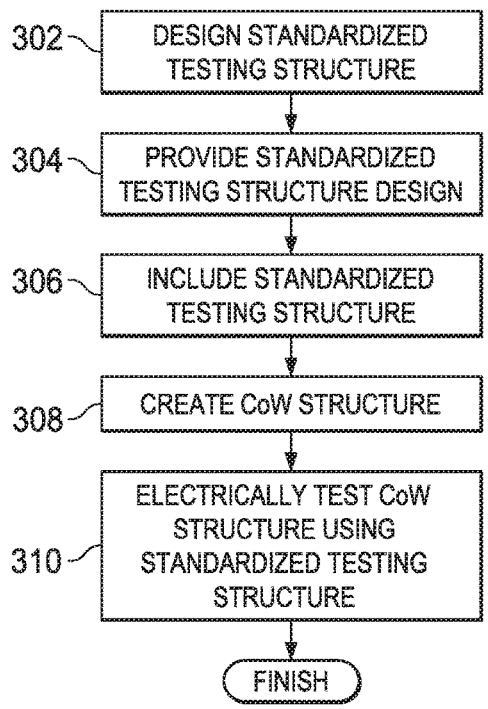
FIGS. 3A-3B are flow diagrams describing CoW testing in accordance with various embodiments.
Figure 3B:
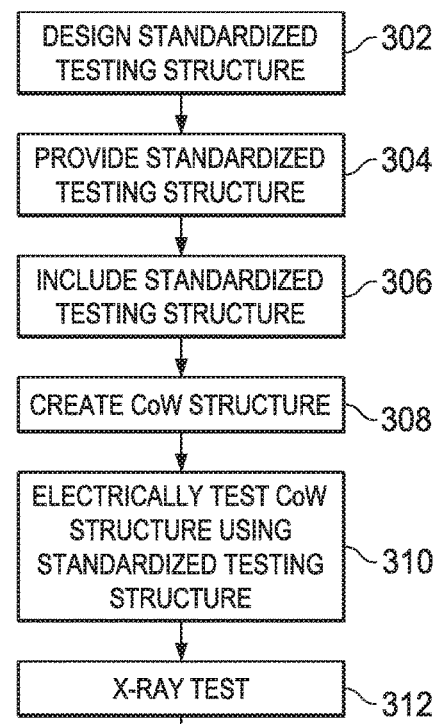

FIGS. 3A-3B illustrate flow diagrams for testing CoW structures in accordance with various embodiments. In step 302, standardized testing structures are designed for implementation in CoW structures. The standardized testing structures design may provide for test bumps configured in various physical measurement patterns such as daisy chains, kelvin structures, and the like. Furthermore, the standardized testing structures designs may provide for standardized testing structures to be disposed in various pre-selected regions of a CoW structure (e.g., sensitive corner regions of a top die). The standardized testing structure design may be included in a variety of CoW structures regardless of the layout of other components (e.g., active circuits) of a top die in the CoW structure.

In step 304, the standardized testing structure design is provided to various chip designers for inclusion in a CoW structure. The standardized testing structure design may include a sample IC layout (e.g., a GDS file) and/or design rules/guidelines for including the standardized testing structure in a CoW structure.

In step 306, a CoW structure is created. Specifically, a top die including physical implementations of the standardized testing structure design disposed in pre-selected regions is attached to a bottom die through a multitude of μbumps. The top die may be a chip including active circuits, while the bottom die may be an interposer wafer. The standardized testing structures include test bumps electrically connected to probing pads located on the peripheral regions of the bottom die.

In step 310, electrical tests are performed on the connection quality of μbumps in the CoW structure via the standardized testing structure. For example, a universal testing probe card may be applied to the probing pads to test the connection quality of the various standardized testing structures. After step 310, manual x-ray examination of various connections in the CoW structure may optionally be performed to ensure connection quality between the top and bottom dies (illustrated in as step 312 in FIG. 3B). Subsequently, the CoW structure may undergo further CoWoS process steps and eventually attached to a suitable substrate to form a CoWoS package.

In accordance with an embodiment, a method for testing a chip-on-wafer (CoW) structure includes providing a standard testing structure design for a CoW structure. The standardized testing structure design includes placing a testing structure in a pre-selected area of a top die in the CoW structure and electrically testing a plurality of microbumps in the CoW structure by applying a universal testing probe card to the testing structure.

In accordance with another embodiment, a method for testing a chip-on-wafer (CoW) structure includes designing a plurality of standardized testing structures for placement in pre-selected regions of a CoW structure. The standardized testing structures are electrically connected to a plurality of probing pads for placement on peripheral regions of a bottom die of the CoW structure. The method further includes electrically testing microbump connections of a plurality of CoW structures, wherein the plurality of CoW structures each include an implementation of the plurality of standardized testing structures electrically connected to the plurality of probing pads.

In accordance with yet another embodiment, a chip-on-wafer (CoW) testing mechanism includes a standardized testing structure configured to be placed in a pre-selected region of a top die of a CoW structure, and a probing pad configured to be placed in a peripheral region of a bottom die of the CoW structure and electronically connected to the standardized testing structure.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for testing a package structure comprising:
    electrically testing a first plurality of conductive connectors in a first package, wherein the first plurality of conductive connectors bonds a first package component to a second package component, and wherein the first package component comprises:
        first testing structures on a first substrate; and
        first functional circuitry on the first substrate and independent from the first testing structures; and
    electrically testing a second plurality of conductive connectors in a second package, wherein the second plurality of conductive connectors bonds a third package component to a fourth package component, and wherein the third package component comprises:
        second testing structures on a second substrate and having a same circuit layout as the first testing structures, wherein a first electrical signal sent through the first testing structures during electrically testing the first plurality of conductive connectors is a same signal as a second electrical signal sent through the second testing structures during electrically testing the second plurality of conductive connectors; and
        second functional circuitry on the second substrate and independent from the second testing structures, wherein the second functional circuitry has a different circuit layout as the first functional circuitry.

2. The method of claim 1, wherein the second package component comprises a first probing pad electrically connected to the first testing structures, wherein electrically testing the first plurality of conductive connectors comprises applying a universal testing probe card to the first probing pad.

3. The method of claim 2, wherein the first probing pad is disposed in a region outside of a footprint of the first substrate in a top-down view.

4. The method of claim 2, wherein the fourth package component comprises a second probing pad electrically connected to the second testing structures, wherein electrically testing the second plurality of conductive connectors comprises applying the universal testing probe card to the second probing pad.

5. The method of claim 1, wherein the first testing structures are disposed in a center region of the first package component.

6. The method of claim 1, wherein the first testing structures are disposed in a corner region of the first package component.

7. The method of claim 1 further comprising after electrically testing the first plurality of conductive connectors, physically examining at least a subset of the first plurality of conductive connectors using an x-ray.

8. The method of claim 1, wherein the first testing structures comprise a daisy chain, a kelvin structure, or a combination thereof.

9. A method comprising:
    bonding a first package component to a second package component using a first plurality of conductive bumps, wherein the first package component comprises:
        first testing structures comprising first test bumps and a first plurality of electrically interconnected conductive lines electrically connected to the first test bumps; and
        first functional circuitry on a same substrate as the first testing structures and independent from the first testing structures;
    bonding a third package component to a fourth package component using a second plurality of conductive bumps, wherein the third package component comprises:
        second testing structures comprising second test bumps and a second plurality of electrically interconnected conductive lines electrically connected to the second test bumps, wherein the first plurality of electrically interconnected conductive lines and the second plurality of electrically interconnected conductive lines have a same layout; and second functional circuitry on a same substrate as the second testing structures and independent from the second testing structures, wherein the second functional circuitry and the first functional circuitry have different layouts;

electrically testing the first plurality of conductive bumps using the first testing structures; and electrically testing the second plurality of conductive bumps using the second testing structures.

10. The method of claim 9, wherein electrically testing the first plurality of conductive bumps and electrically testing the second plurality of conductive bumps comprises applying a same testing probe card to a first probing pad disposed on the second package component and a second probing pad disposed on the fourth package component.

11. The method of claim 9, wherein a location of the first testing structures in the first package component is the same as a relative location of the second testing structures in the second package component.

12. The method of claim 9, wherein the first testing structures are disposed in a central region of the first package component, a corner region of the first package component, or a combination thereof.

13. The method of claim 9, wherein the first testing structures comprises a daisy chain, a kelvin structure, or a combination thereof.

14. The method of claim 9, wherein electrically testing the first plurality of conductive bumps comprises sending a first test signal through the first plurality of conductive bumps, wherein electrically testing the second plurality of conductive bumps comprises sending a second test signal through the second plurality of conductive bumps, and wherein the first test signal and the second test signal are the same signal.

15. The method of claim 9 further comprising performing an x-ray test on the first plurality of conductive bumps.

16. A method comprising
providing a testing structure design, the testing structure design defining:
test bumps; and
a plurality of conductive lines electrically connected to the test bumps;

disposing a first package component in a first package, wherein the first package component comprises:
first testing structures in accordance with the testing structure design; and
first functional circuitry formed on a same substrate as the first testing structures and independent from the first testing structures; and disposing a second package component in a second package, wherein the second package component comprises:
second testing structures in accordance with the testing structure design; and
second functional circuitry formed on a same substrate as the second testing structures and independent from the second testing structures, wherein the second functional circuitry and the first functional circuitry have different layouts.

17. The method of claim 16, wherein the first package further comprises a third package component bonded to the first package component through a first plurality of conductive connectors, wherein the method further comprises electrically testing the first plurality of conductive connectors by sending a first test signal through the first testing structures.

18. The method of claim 17, wherein the second package further comprises a fourth package component bonded to the second package component through a second plurality of conductive connectors, wherein the method further comprises electrically testing the second plurality of conductive connectors by sending a second test signal through the second testing structures, and wherein the first test signal is the same signal as the second test signal.

19. The method of claim 16, wherein the testing structure design designates a relative location for placement of testing structures within a package component.

20. The method of claim 16, wherein the plurality of conductive lines comprises a daisy chain, a kelvin structure, or a combination thereof.

* * * * *